United States Patent [19]

Ciraula et al.

[11] Patent Number: 4,996,670
[45] Date of Patent: Feb. 26, 1991

[54] ZERO STANDBY POWER, RADIATION HARDENED, MEMORY REDUNDANCY CIRCUIT

[75] Inventors: Michael K. Ciraula; Christopher M. Durham, both of Manassas; Derwin L. Jallice, Reston, all of Va.

[73] Assignee: International Business Machines Corporation, Armonk, N.Y.

[21] Appl. No.: 414,889

[22] Filed: Sep. 28, 1989

[51] Int. Cl.⁵ .................. G11C 7/00; G11C 11/40; G11C 11/407
[52] U.S. Cl. .................. 365/200; 365/225.7; 365/230.01; 365/230.06; 365/189.02
[58] Field of Search ............. 365/200, 225.7, 189.02, 365/96, 230.01, 230.06; 371/10.2; 307/441

[56] References Cited

U.S. PATENT DOCUMENTS

| | | | |
|---|---|---|---|
| 4,281,398 | 7/1981 | McKenny et al. | 365/200 |
| 4,346,549 | 8/1982 | Sud et al. | 371/10.2 |
| 4,406,013 | 9/1983 | Reese et al. | 377/29 |
| 4,441,170 | 4/1984 | Folmsbee et al. | 365/200 |
| 4,471,472 | 9/1984 | Young | 365/200 |
| 4,546,455 | 10/1985 | Iwahashi | 365/225.7 X |
| 4,590,388 | 5/1986 | Clemons et al. | 307/202.1 |
| 4,603,404 | 7/1986 | Yamauchi et al. | 365/200 |
| 4,613,959 | 9/1986 | Jiang | 365/200 |
| 4,633,429 | 12/1986 | Lewandowski et al. | 365/200 |
| 4,635,232 | 1/1987 | Iwahashi et al. | 365/200 |
| 4,691,301 | 9/1987 | Anderson | 365/225.7 X |
| 4,703,436 | 10/1987 | Varshney | 364/490 |
| 4,720,817 | 1/1988 | Childers | 365/200 |
| 4,800,332 | 1/1989 | Hutchins | 371/10.2 |

*Primary Examiner*—Glenn Gossage
*Assistant Examiner*—Alyssa H. Bowler
*Attorney, Agent, or Firm*—John E. Hoel; Mark A. Wurm

[57] ABSTRACT

A fused, redundancy selection circuit is disclosed which is disabled by the absence of a chip select signal. The circuit has the feature of avoiding the use of nodes with a floating potential and in this manner it provides an enhanced radiation hardened characteristic. The circuit is effectively disabled if no redundancy is required on a particular memory chip, by leaving fuses which are a part of the circuit, intact. Alternately, if the memory chip is tested to have defects, the redundancy circuit is selectively enabled to provide the desired redundancy for the chip, by blowing fuses which are a part of the circuit. Thereafter, the redundancy circuit is now an active part of the memory chip and it is selectively enabled when the chip select signal is applied to the chip. An advantageous feature of the circuit is that it does not dissipate power when its function is not required either because its enabling fuses have not been blown or alternately when the chip select signal is off. In this manner, a zero standby power, radiation hardened memory redundancy circuit has been provided.

3 Claims, 4 Drawing Sheets

ZERO STANDBY POWER, RADIATION HARDENED, MEMORY REDUNDANCY CIRCUIT

This invention was made with Government support under contract Number F29601-87-C-0006 awarded by the Department of the Air Force. The Government has certain rights in this invention.

BACKGROUND OF THE INVENTION

1. Technical Field

The invention disclosed broadly relates to semiconductor memory circuits and more particularly relates to improvements in radiation hardened, redundant circuits for memories.

2. Background Art

On semiconductor memory chips, spare memory locations are included to replace nonfunctioning regular locations. Reprogrammable redundant word and bit lines are designed into the chip to replace bad word or bit lines. This programming can be done at the time of manufacturing testing by blowing fuses included in the circuit, to deselect a bad word or bad bit line and to replace it with one of the redundant lines. The typical prior art redundancy selection circuit is selectively enabled by blowing a fuse contained in the redundancy circuit. One problem with such prior art circuits is that whether or not the circuit has been enabled, it still dissipates power during ordinary operation of the memory chip. The additional contribution of power dissipation is a disadvantage for such prior art designs. Other prior art redundancy selection circuits which are selected by blowing a fuse, include the feature that the redundancy circuit, after having been enabled by blowing a fuse, will be effectively enabled or disabled by the chip select signal applied to the memory chip. This provides for eliminating power dissipation contributed by the redundancy circuit when the memory chip is not selected. However this prior art redundancy circuit still suffers from additional power dissipation when the chip select signal is on regardless of whether the fuses have been blown or not. Once again, the minimization of power dissipation is a sought-after advantage which has been difficult to achieve in the prior art where redundancy circuits are used on memory chips. Still further, when a static memory chip is exposed to a high radiation environment, significant problems occur in maintaining the binary states of the storage cells. Prior art redundancy circuits have failed to provide for enhanced radiation hardness, because they typically include nodes having a floating potential.

OBJECTS OF THE INVENTION

It is therefore an object of the invention to provide an improved memory redundancy circuit.

It is another object of the invention to provide an improved memory redundancy circuit which minimizes power dissipation.

It is still a further object of the invention to provide an improved memory redundancy circuit which has enhanced radiation hardness characteristics.

SUMMARY OF THE INVENTION

These and other objects, features and advantages of the invention are accomplished by the zero standby radiation hardened memory redundancy circuit disclosed herein. A fused, redundancy selection circuit is disclosed which is disabled by the absence of a chip select signal. The circuit has the feature of avoiding the use of nodes with a floating potential and in this manner it provides an enhanced radiation hardened characteristic. The circuit is effectively disabled if no redundancy is required on a particular memory chip, by leaving fuses which are a part of the circuit, intact. Alternately, if the memory chip is tested to have defects, the redundancy circuit is selectively enabled to provide the desired redundancy for the chip, by blowing fuses which are a part of the circuit. Thereafter, the redundancy circuit is an active part of the memory chip and it is selectively enabled when the chip select signal is applied to the chip. An advantageous feature of the circuit is that it does not dissipate power when its function is not required either because its enabling fuses have not been blown or alternately when the chip select signal is off. In this manner, a zero standby power, radiation hardened memory redundancy circuit has been provided.

BRIEF DESCRIPTION OF THE DRAWINGS

These and other objects, features and advantages of the invention will be more fully appreciated with reference to the accompany figures.

DESCRIPTION OF THE BEST MODE FOR CARRYING OUT THE INVENTION

Figure 1:
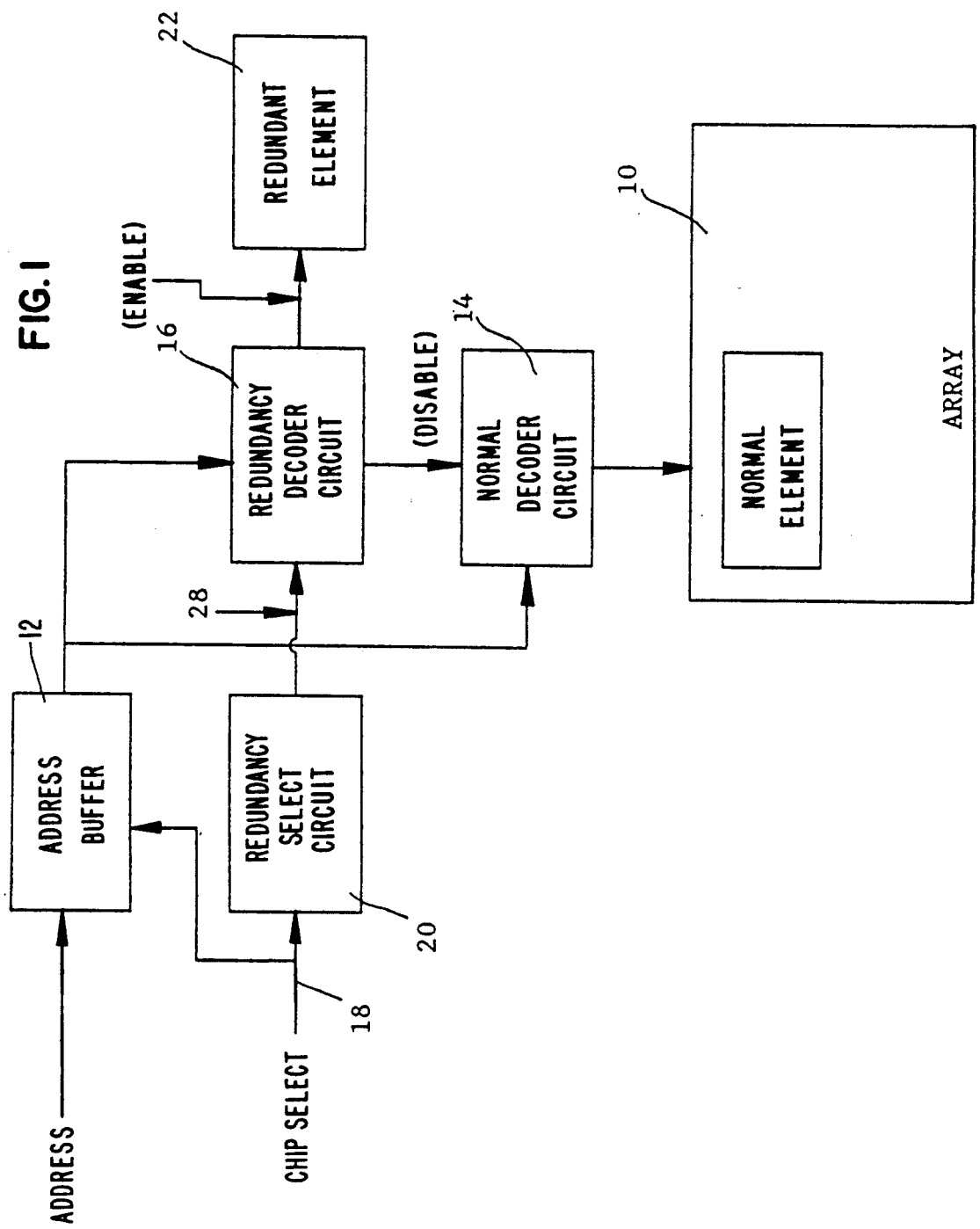
FIG. 1 is an overall architectural diagram of a memory chip showing the relationship of the redundancy circuit to the balance of the memory chip circuitry.

FIG. 1 is an overall architectural block diagram of the relationship of the redundancy selection circuit to the balance of a static memory array. The static memory array 10 consists of rows and columns of static flip-flop memory cell devices which are addressed by means of an eight bit or 16 bit wide address, for example. The 16 bit address for this example, is applied to the address buffer 12 for staging purposes and the 16 bits are then applied to both the normal decoder 14 and the redundancy decoder 16. The chip select signal 18 is applied to both the redundancy selection circuit 20 and to the address buffer 12 and it serves to enable the memory chip. When the chip select signal on line 18 is in its enabling state, the address buffer 12 will gate any address bits applied to its input, to the normal decoder 14. The normal decoder 14 is normally enabled and will decode the address value applied to it by the address buffer 12 and will address the appropriate column and row of the array 10 to access the desired memory cell. At the time of manufacture of the memory chip, if testing determines that a column or a row of storage cells in the array 10 contains a defective cell, then at the time of manufacture, appropriate selection fuses are blown in the redundancy selection circuit 20 and appropriate decoding circuits are blown in the redundancy decoder 16 so that when the column or the row containing the defective cell is addressed, the redundancy decoder 16 will disable the normal decoder 14 and will enable the redundant spare column or row 22. In this manner, the use of the defective storage cell is avoided.

Figure 2:
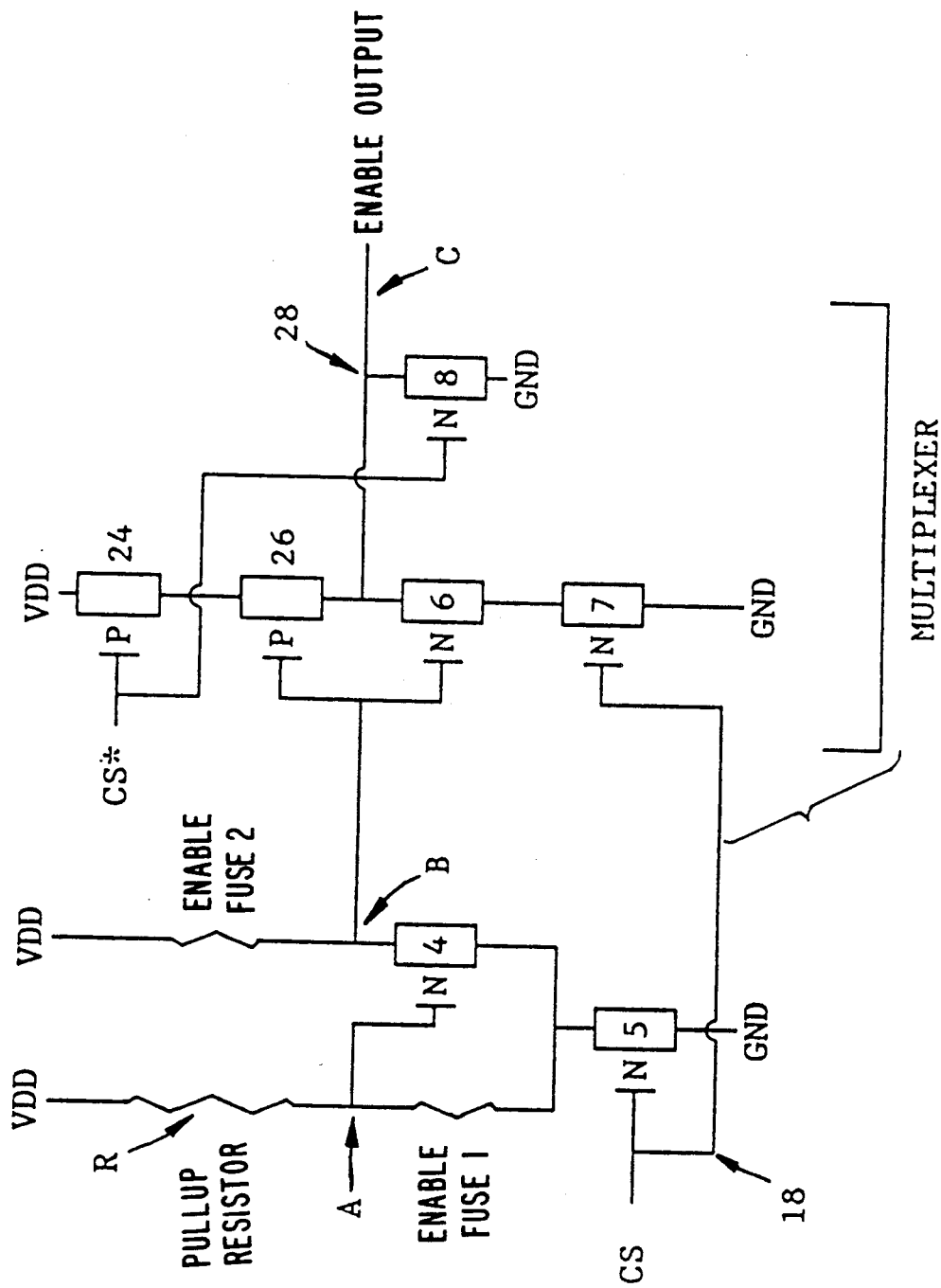
FIG. 2 a circuit diagram of the redundancy circuit invention, where the enablement fuses have not been blown.

The redundancy selection circuit 20 is shown in more detail in the circuit schematic diagram of FIG. 2. The circuit shown in FIG. 2 is a CMOS circuit having a first enabling fuse 1 and a second enabling fuse 2 connected as shown in FIG. 2. The circuit of FIG. 2 is connected between a positive potential VDD and ground potential GND. The circuit consists of a pullup resistor R which is connected between VDD and a first node A. The first enable fuse 1 is connected between the node A and the drain of the N channel FET device 5, whose source is connected to ground potential and whose gate is connected by line 18 to the chip select signal CS. The circuit further includes the second enabling fuse 2 which is connected between VDD and a second node B. A second N channel FET device 4 has its drain connected to node B and its source connected to the drain of the N channel FET device 5. The gate of FET device 4 is connected to node A. The circuit of FIG. 2 further includes the P channel FET device 24 whose source is connected to VDD and whose drain is connected to the source of the P channel FET device 26. The P channel FET device 26 has its drain connected to a node C. An N channel FET device 6 has its drain connected to node C and its source connected to the drain of the N channel FET device 7. The N channel FET device 7 has its source connected to ground potential. The gate of the P channel FET device 24 is connected to the complement of the chip select signal CS*. The gate of the P channel FET device 26 and the gate of the N channel FET device 6 are connected in common to the node B. The gate of the N channel FET device 7 is connected to the true value of the chip select signal CS. The circuit of FIG. 2 further includes an N channel FET device 8 whose drain is connected at node C. The source of the N channel FET device 8 is connected to ground potential and the gate is connected to the complement of the chip select signal CS*. The portion of the circuit consisting of devices 24, 26, 6, 7 and 8 functions as a multiplexer. Node C is connected to line 28 which is the enable output to the redundancy decoder 16. This constitutes the basic circuit invention. The circuit in FIG. 2 can optionally further include an output inverter circuit at node C.

The circuit of FIG. 2 shows the enabling fuses 1 and 2 remaining intact. The operation of the circuit in FIG. 2 is as follows. If the two fuses are not blown, then enable output 28 remains low at all times for the following reasons. If CS is low (indicating that the chip is not selected), then CS* is high which turns N channel FET device 8 on thus forcing node C low, making enable 28 low. There is no DC power consumption (standby power) in the circuit since N device 5 is off and, therefore, no direct path occurs to ground. If CS is high (chip selected), then N channel FET device 5 turns on which pulls node A low. This occurs because the resistance of enable fuse 1 (on the order of 100 ohms) will be much smaller than the pullup resistance R (on the order of a few hundred kilohms) implying that there in only a small voltage drop across fuse 1, thereby making node A approximately ground potential. N channel FET device 4 is then off, isolating node B from ground, thus node B is held high via fuse 2 to VDD. Node C potential is low since N channel FET devices 6 and 7 are now on which makes enable 28 low again. The only DC power consumption (active) which occurs through the path through the pullup resistor R and enable fuse 1 to ground via N channel FET device 5. This power will be small since Power=((VDD)**2)/(RESISTANCE).

For a pullup resistor R of 500 kilohms and VDD of 5 volts, this power will only be 50 microwatts. Therefore, the active power is negligible.

Figure 3:
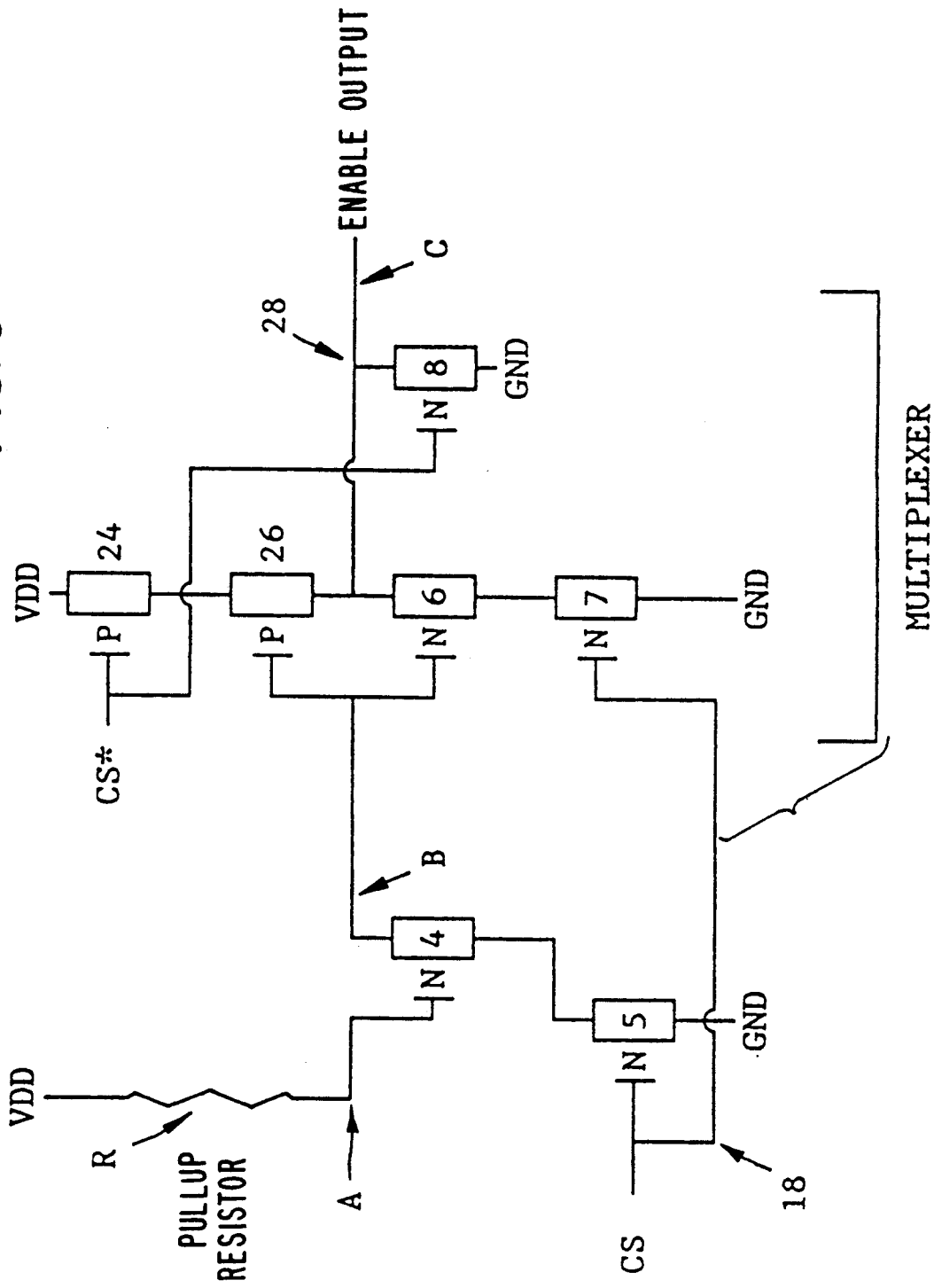
FIG. 3 is another view of the circuit of FIG. 2, where the enablement fuses have been blown.

FIG. 3 shows the circuit of FIG. 2 with the two fuses 1 and 2 blown. In such a state the appropriate decoding fuses in the redundancy decoder 16 will also be blown to indicate the particular column or row in the array 10 which is to be deleted so that the redundant column or row for redundant element 22 can be substituted. The circuit of FIG. 3 operates as follows. If the enabling fuses 1 and 2 are blown, then redundancy is selected and the circuit is as in FIG. 3. Note that node A will be high to potential VDD at all times via the pullup resistor R. This will cause the enable output 28 to be high when CS is high and to be low when CS is low. Thus the circuit of FIG. 3 does not dissipate power when the chip is not selected.

The resulting circuit provides a fuse redundancy selection circuit which has superior radiation hardness characteristics and dissipates minimal power in all non-selected states. The radiation hardness is accomplished by avoiding floating nodes.

Figure 4:
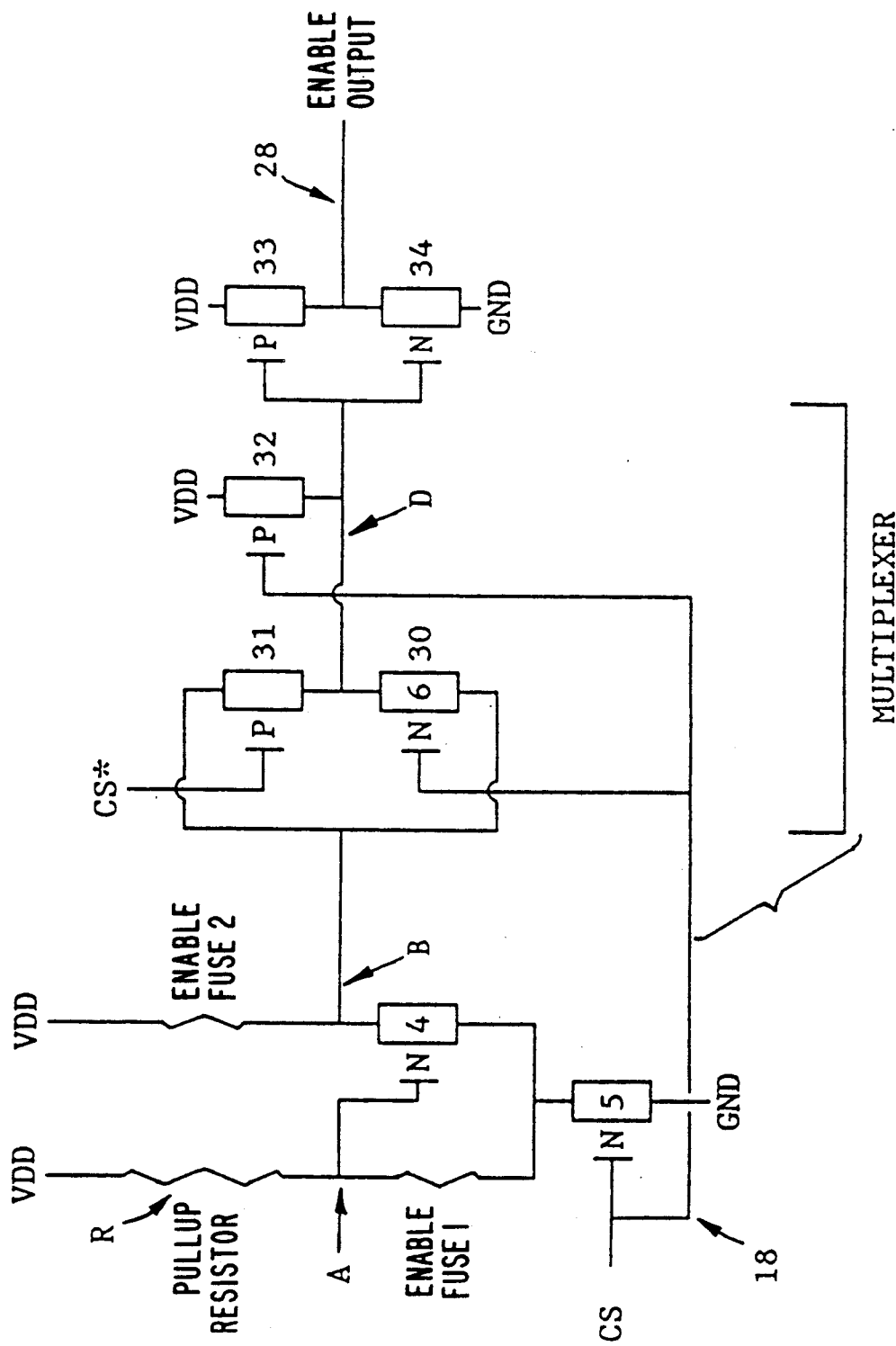
FIG. 4 shows an alternate embodiment of the invention.

FIG. 4 shows an alternate embodiment of the invention in which the multiplexer consisting of devices 24, 26, 6, 7 and 8 of FIGS. 2 and 3 are replaced by devices 30, 31, 32, 33 and 34 of FIG. 4. Devices 30 and 31 of FIG. 4 represent a pass gate consisting of an N channel FET device 30 whose gate is connected to the chip select signal CS and the P channel FET device 31 whose gate is connected to the complement chip select signal CS*. Also included in FIG. 4 is a P channel FET device 32 whose gate is connected to the chip select signal CS and device 32 has its source-drain path connected between the output node D and the positive potential VDD. P channel FET device 33 and N channel FET device 34 functions as an inverter circuit between node D and the enable output 28. In this manner, the multiplexer operation of devices 24, 26, 6, 7 and 8 in FIGS. 2 and 3 is accomplished by the pass gate configuration of devices 30-34 of FIG. 4.

The circuit of FIGS. 2, 3 and 4 is designed to avoid floating potential nodes; that is the circuit does not rely on the storage of charge at any node. Thus, if any portion of the circuit encounters ionizing radiation, there will be no resulting inadvertent change of logic state. This radiation hardness feature combined with the low power dissipation characteristic of the circuit, makes the circuit ideal for use in space-borne applications.

Although specific embodiments of the invention have been disclosed, it will be understood by those having skill in the art that changes can be made to those specific embodiments without departing from the spirit and the scope of the invention.

What is claimed is:

1. A radiation hardened redundancy circuit for a memory having low power dissipation characteristics, comprising:
   a first N channel FET device having its drain connected to a first node and its source connected to ground potential and its gate connected to a chip select signal;
   a first enabling fuse connected between said first node and a second node;
   a pullup impedance device connected between said second node and a positive potential;
   a second N channel FET device having its drain connected to a third node, its source connected to said first node and its gate connected to said second node;

a second enabling fuse connected between said third node and said positive potential;

a multiplexer circuit having a data input connected to said third node, a control input connected to said chip select signal and having an output node coupled to a redundant storage element in a memory array, for selectively substituting said redundant storage element for a failing storage element in said memory array;

whereby a redundancy circuit is provided having no floating potential nodes and a reduced power dissipation characteristic.

2. The circuit of claim 1, wherein a decoder circuit is connected between said output node and said redundant storage element.

3. The circuit of claim 2, wherein said decoder circuit has an output connected to said failing storage element.

* * * * *